United States Patent
Jang

(10) Patent No.: US 7,633,161 B2
(45) Date of Patent: Dec. 15, 2009

(54) SEMICONDUCTOR DEVICE AND METHOD OF FORMING METAL INTERCONNECTION LAYER THEREOF

(75) Inventor: Sung Ho Jang, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/254,304

(22) Filed: Oct. 20, 2008

(65) Prior Publication Data

US 2009/0166869 A1  Jul. 2, 2009

(30) Foreign Application Priority Data

Dec. 27, 2007  (KR) .................. 10-2007-0139167

(51) Int. Cl.
*H01L 23/485* (2006.01)
(52) U.S. Cl. .............. 257/751; 438/629; 438/639; 438/653; 438/672; 438/687; 257/E21.175; 257/E21.584; 257/752; 257/762
(58) Field of Classification Search ........ 438/627, 438/629, 639, 653, 672, 687, FOR. 350; 257/751, 752, 762, E21.175, E21.584
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 5,969,422 A * | 10/1999 | Ting et al. | 257/762 |
| 6,181,012 B1 * | 1/2001 | Edelstein et al. | 257/762 |
| 6,399,496 B1 * | 6/2002 | Edelstein et al. | 438/687 |
| 6,656,841 B1 * | 12/2003 | Kim | 438/687 |
| 7,119,018 B2 * | 10/2006 | Lane et al. | 438/686 |
| 7,276,796 B1 * | 10/2007 | Yang et al. | 257/751 |
| 7,300,860 B2 * | 11/2007 | Dubin | 438/584 |
| 7,405,153 B2 * | 7/2008 | Malhotra et al. | 438/628 |
| 7,405,154 B2 * | 7/2008 | Cabral et al. | 438/630 |
| 7,482,269 B2 * | 1/2009 | Suzuki | 438/650 |
| 7,498,256 B2 * | 3/2009 | Knarr et al. | 438/627 |
| 7,528,066 B2 * | 5/2009 | Yang et al. | 438/645 |
| 2002/0000382 A1 * | 1/2002 | Morrissey et al. | 205/115 |
| 2003/0201538 A1 * | 10/2003 | Lee et al. | 257/751 |
| 2007/0026631 A1 * | 2/2007 | Lin et al. | 438/424 |
| 2007/0045855 A1 * | 3/2007 | Lo et al. | 257/771 |
| 2007/0164279 A1 * | 7/2007 | Lin et al. | 257/48 |
| 2007/0205520 A1 * | 9/2007 | Chou et al. | 257/780 |
| 2008/0132062 A1 * | 6/2008 | Furuya | 438/653 |

(Continued)

FOREIGN PATENT DOCUMENTS

KR  10-1999-0083124  11/1999

(Continued)

*Primary Examiner*—George Fourson
(74) *Attorney, Agent, or Firm*—Workman Nydegger

(57) ABSTRACT

Technologies related to forming metal lines of a semiconductor device are disclosed. A method of forming metal lines of a semiconductor device may include forming at least one interlayer insulating layer on a semiconductor substrate, forming via holes and trenches in the at least one interlayer insulating layer, forming an anti-diffusion film on the via holes and the trenches, depositing a seed Cu layer on the anti-diffusion film, after the seed Cu layer is deposited, depositing rhodium (Rh), and forming Cu line on the deposited Rh. The Rh improves an adhesive force between Cu layers and prevents oxide materials or a corrosion phenomenon from occurring on the seed Cu layer. Accordingly, occurrence of delamination in subsequent processes (for example, annealing and CMP) can be prevented or reduced.

11 Claims, 3 Drawing Sheets

U.S. PATENT DOCUMENTS

| | | | | |
|---|---|---|---|---|
| 2008/0206899 | A1* | 8/2008 | Furuya | 438/7 |
| 2008/0265413 | A1* | 10/2008 | Chou et al. | 257/737 |
| 2009/0108453 | A1* | 4/2009 | Lin et al. | 257/758 |
| 2009/0166869 | A1* | 7/2009 | Jang | 257/751 |

FOREIGN PATENT DOCUMENTS

| | | |
|---|---|---|
| KR | 10-2003-0079745 | 10/2003 |

* cited by examiner

SEMICONDUCTOR DEVICE AND METHOD OF FORMING METAL INTERCONNECTION LAYER THEREOF

CROSS-REFERENCE TO RELATED APPLICATION

This application claims priority to Korean Application No. 10-2007-0139167, filed on Dec. 27, 2007, which is incorporated herein by reference in its entirety.

BACKGROUND

1. Field of the Invention

Embodiments of the present invention generally relate to a technology for forming metal lines in a semiconductor device.

2. Description of Related Art

In accordance with the ongoing reduction in size of semiconductor devices, the cross sectional area of a semiconductor line is continually reduced, causing a rise in current density. As a result, electromigration (EM) in the metal lines severely reduces reliability. Accordingly, active research and development has been done on the use of different materials for the metal lines in semiconductor devices. For example, Cu has excellent reliability while having lower resistivity than aluminum (Al). However, Cu is difficult to form into a compound with a high enough volatility to easily form micro patterns using a dry etch process.

In order to address the difficulty of patterning Cu lines, a damascene process has been introduced. The damascene process, which employs chemical mechanical polishing (hereinafter referred to as 'CMP'), includes depositing an inter metal dielectric (hereinafter referred to as 'IMD'), forming trenches, that is, interconnection areas by patterning the IMD using a photolithography process, gap-filling the trenches with Cu, and polishing the gap-filled Cu layer using CMP, thus forming the Cu lines.

A dual damascene process, which is now generally used in a multi-layered metal line, can accomplish formation of vias and metal lines at the same time with one CMP process.

This dual damascene process is described in detail below with reference to the drawings.

FIGS. 1A to 1C are flowcharts illustrating conventional steps of forming the Cu line of a semiconductor device.

Referring to FIG. 1A, a first interlayer insulating film (e.g., nitride film) 102, a first IMD 104, and a second interlayer insulating film 106 are sequentially deposited over an upper IMD 100 of a semiconductor substrate. The first interlayer insulating film 104 and the second interlayer insulating film 106 are patterned using a photolithography process, thus forming via holes and trenches, that is, line areas. The via holes may be formed first and the trenches may be formed second, or vice versa.

An anti-diffusion film 108 made of Ta/TaN is formed on the via holes and the trenches. A seed Cu layer 110 is formed on the anti-diffusion film 108. The trenches are then gap-filled with a main layer of Cu using an electroplating method, as shown in FIG. 1B. The main Cu layer is polished using CMP, thereby forming Cu lines as shown in FIG. 1C.

When the Cu metal lines are formed using a general dual damascene as described above, the anti-diffusion film 108 made of Ta/TaN and formed in the vias and trenches functions to prevent the subsequently deposited Cu from diffusing into an insulating film.

In the conventional method of forming the Cu metal lines as described above, an irregular surface can result between the anti-diffusion film 108 and the seed Cu layer 110 due to failure in adhesive force, oxidization, corrosion, or for some other reason. Consequently, delamination or lifting occurs between layers due to a stress difference caused by a subsequent anneal process or physical force when Cu CMP is performed.

SUMMARY OF SOME EXAMPLE EMBODIMENTS

In general, example embodiments of the invention relate to a method of forming metal lines of a semiconductor device, in which occurrence of delamination between an anti-diffusion film and a seed Cu layer is prevented or reduced when Cu metal lines are formed by a dual damascene process.

In accordance with a first embodiment, a method of forming metal lines of a semiconductor device includes forming at least one interlayer insulating layer on a semiconductor substrate, forming via holes and trenches in the at least one interlayer insulating layer, forming an anti-diffusion film on the via holes and the trenches, depositing a seed copper (Cu) layer on the anti-diffusion film, after the seed Cu layer is deposited, depositing rhodium (Rh), and forming a Cu line on the deposited Rh.

In accordance with a second embodiment, a semiconductor device includes at least one interlayer insulating layer formed on a semiconductor substrate, via holes and trenches formed in the at least one interlayer insulating layer, and an anti-diffusion film formed on the via holes and the trenches. The semiconductor device further includes a seed Cu layer deposited on the anti-diffusion film, Rh deposited on the seed Cu layer, and a Cu line formed on the deposited Rh.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Figure 1A:
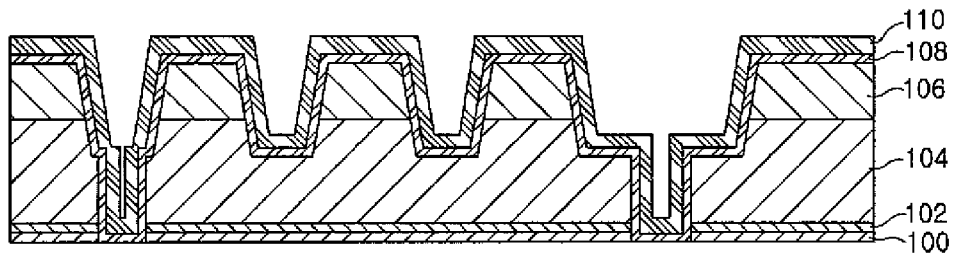
FIGS. 1A to 1C are flowcharts illustrating conventional steps of forming the Cu line of a semiconductor device.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled. Detailed description of known functions and constructions are omitted where their inclusion would make the description unnecessarily vague.

Embodiments of the present invention prevent or reduce occurrence of delamination between an anti-diffusion film and a seed Cu layer when a dual damascene process is carried out to form Cu metal lines. In an example embodiment, the anti-diffusion film and the seed Cu layer may be sequentially formed, Rh may be deposited, and a Cu layer may then be formed.

FIGS. 2A to 2D are flowcharts illustrating steps of forming the Cu line of a semiconductor device in accordance with an embodiment of the present embodiment.

Figure 2A:
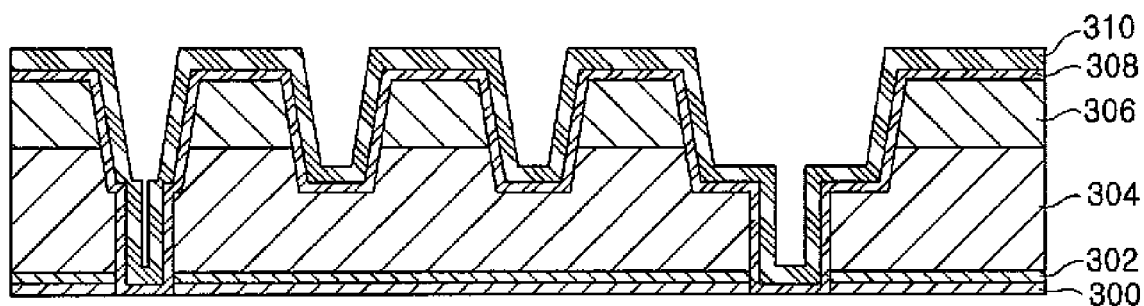
FIGS. 2A to 2D are flowcharts illustrating steps of forming the Cu line of a semiconductor device in accordance with an example embodiment of the present embodiment.

Referring to FIG. 2A, a first interlayer insulating film (e.g., a nitride film) 302, a first interlayer insulating film 304, and a second interlayer insulating film 306 may be sequentially formed over an IMD 300 of a semiconductor substrate. Via holes and trenches, that is, line areas may be formed by patterning the first interlayer insulating film 304 and the second interlayer insulating film 306 through a photolithography process. The via holes may be formed first and the trenches may be formed second, or vice versa.

An anti-diffusion film 308 made of Ta/TaN may be formed on the via holes and the trenches using a physical vapor deposition (PVD) method. A seed Cu layer 310 may be formed on the anti-diffusion film 308 using a PVD or atomic layer deposition (ALD) method.

Figure 1B:
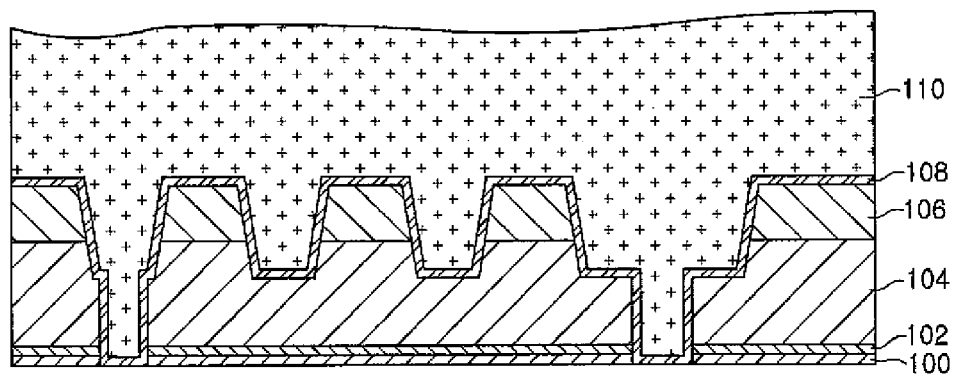
Figure 1C:
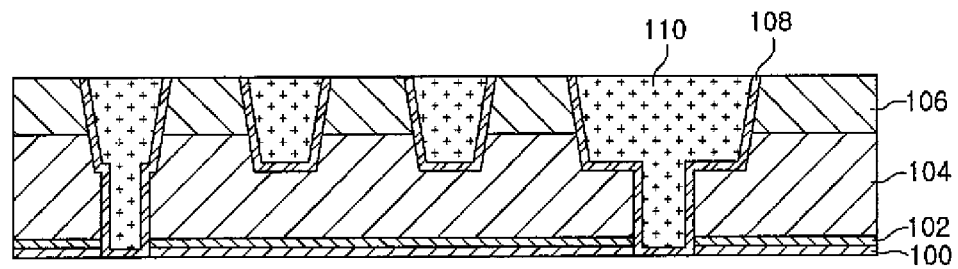
Figure 2B:
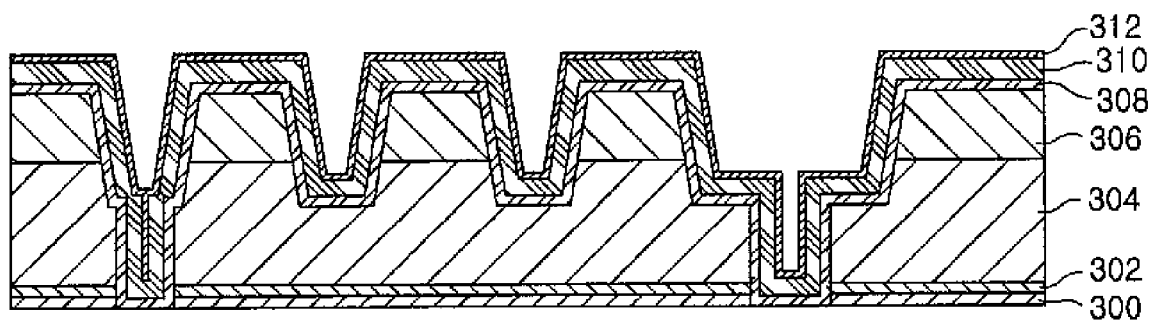

As explained above in reference to FIG. 1B, a copper (Cu) layer is conventionally deposited directly on the seed Cu layer 310 in order to form Cu lines. However, this method can generate delamination. Accordingly, in an embodiment of the present invention, Rh 312 may be deposited on the seed Cu layer 310, as shown in FIG. 2B.

The deposited Rh 312 may be deposited through electroplating using an $H_2SO_4$-based plating solution in order to facilitate an adhesive force between the seed Cu layer 310 and a subsequently formed main Cu layer. In particular, the deposited Rh 312 functions to prohibit oxide materials and a corrosion phenomenon from occurring on the seed Cu layer 310. The deposited Rh 312 may be deposited to a thickness of 50 to 300 angstroms.

Figure 2C:
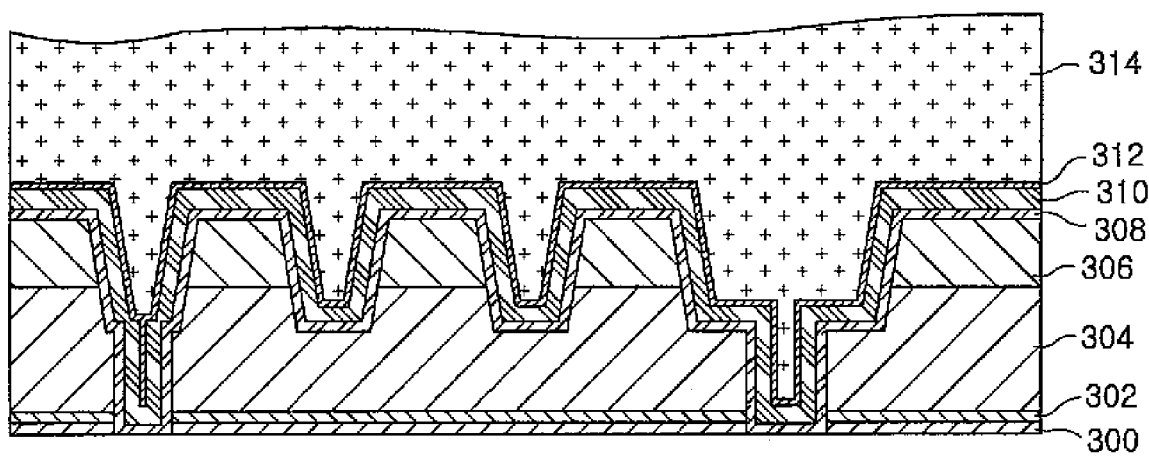
Figure 2D:
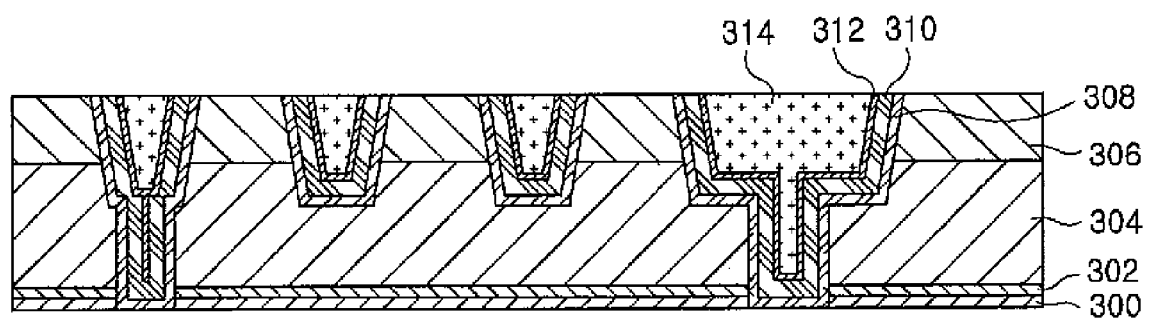

The main Cu layer 314 may be coated on the Rh 312 so that the trenches are gap-filled, as shown in FIG. 2C and then polished using CMP, thereby forming Cu lines as shown in FIG. 2D.

As described above, embodiments of the present invention prevent or reduce occurrence of delamination between an anti-diffusion film and a seed Cu layer when a dual damascene process is carried out to form Cu metal lines. For example, the anti-diffusion film and the seed Cu layer may be sequentially formed, Rh may be deposited, and the Cu layer may then be formed. Accordingly, occurrence of delamination between the anti-diffusion film and the seed Cu layer can be prevented or reduced.

Deposition of Rh, which is an electrochemically safe metal, between the seed Cu layer and the main Cu layer provides a robust adhesive force between the two Cu layers and prohibits oxide materials or a corrosion phenomenon from occurring on the seed Cu layer. Accordingly, delamination in subsequent processes (for example, annealing and CMP) is prevented or reduced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming metal lines of a semiconductor device, the method comprising:
    forming at least one interlayer insulating layer on a semiconductor substrate;
    forming via holes and trenches in the at least one interlayer insulating layer;
    forming an anti-diffusion film on the via holes and the trenches;
    depositing a seed copper (Cu) layer on the anti-diffusion film;
    after the seed Cu layer is deposited, depositing rhodium (Rh); and
    forming a Cu line on the deposited Rh.

2. The method of claim 1, wherein forming the Cu lines on the Rh comprises:
    depositing a Cu layer on a surface of the deposited Rh; and
    performing chemical mechanical polishing (CMP) on the Cu layer.

3. The method of claim 1, wherein the anti-diffusion film comprises Ta/TaN or Ti/TiN.

4. The method of claim 1, wherein the Rh is deposited through electroplating using an $H_2SO_4$-based plating solution.

5. The method of claim 1, wherein the seed Cu layer is formed on the anti-diffusion film using a PVD or atomic layer deposition (ALD) method.

6. The method of claim 1, wherein the Rh is deposited to a thickness of 50 to 300 Å.

7. A semiconductor device comprising:
    at least one interlayer insulating layer formed on a semiconductor substrate;
    via holes and trenches formed in the at least one interlayer insulating layer;
    an anti-diffusion film formed on the via holes and the trenches;
    a seed Cu layer deposited on the anti-diffusion film;
    Rh deposited on the seed Cu layer; and
    a Cu line formed on the deposited Rh.

8. The semiconductor device of claim 7, wherein the anti-diffusion film comprises Ta/TaN or Ti/TiN.

9. The semiconductor device of claim 7, wherein the Rh is deposited through electroplating using an $H_2SO_4$-based plating solution.

10. The semiconductor device of claim 7, wherein the seed Cu layer is formed on the anti-diffusion film using a PVD or ALD method.

11. The semiconductor device of claim 7, wherein the Rh is deposited to a thickness of 50 to 300 Å.

* * * * *